(12) United States Patent
Mukae

(10) Patent No.: US 8,004,151 B2
(45) Date of Patent: Aug. 23, 2011

(54) DRIVE UNIT

(75) Inventor: Hideaki Mukae, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/829,451

(22) Filed: Jul. 2, 2010

(65) Prior Publication Data

US 2011/0001391 A1    Jan. 6, 2011

(30) Foreign Application Priority Data

Jul. 2, 2009  (JP) .................................. 2009-158054

(51) Int. Cl.
*H01L 41/08* (2006.01)
(52) U.S. Cl. .................................................. 310/323.02
(58) Field of Classification Search ............ 310/323.02, 310/323.03, 323.11
See application file for complete search history.

(56) References Cited

U.S. PATENT DOCUMENTS

| 5,818,147 | A | 10/1998 | Kobayashi et al. |
| 5,932,952 | A * | 8/1999 | Takagi ...................... 310/323.02 |
| 6,107,724 | A | 8/2000 | Tamai et al. |
| 6,643,906 | B2 * | 11/2003 | Kitajima et al. ............. 29/419.1 |
| 7,211,929 | B2 * | 5/2007 | Ganor et al. ................... 310/317 |
| 2007/0188051 | A1 * | 8/2007 | Kobayashi et al. ...... 310/323.11 |

FOREIGN PATENT DOCUMENTS

| JP | 9-0331687 | 12/1997 |
| JP | 10-084682 | 3/1998 |
| JP | 3744111 B2 | 12/2005 |

* cited by examiner

*Primary Examiner* — Mark Budd
(74) *Attorney, Agent, or Firm* — Renner, Otto, Boisselle & Sklar, LLP

(57) ABSTRACT

A drive unit includes an ultrasonic actuator having an actuator body generating vibration, and diver elements attached to the actuator body to output drive force by generating orbit motion in response to the vibration of the actuator body; and a movable body contacting the driver elements, and relatively moving with respect to the ultrasonic actuator. In a surface of the movable body, which contacts the driver elements, smoothed portions are interleaved with recessed portions which are recessed with respect to the smoothed portions.

1 Claim, 11 Drawing Sheets

Brightness Level

Brightness Level

Brightness Level

US 8,004,151 B2

DRIVE UNIT

CROSS-REFERENCE TO RELATED APPLICATION

This application claims priority to Japanese Patent Application No. 2009-158054 filed on Jul. 2, 2009, and the disclosure of which including the specification, the drawings, and the claims is hereby incorporated by reference in its entirety.

BACKGROUND

The present disclosure relates to a drive unit including a vibratory actuator and a relatively-movable member.

Conventionally, a drive unit including a vibratory actuator and a relatively-movable member has been known. Specifically, the vibratory actuator includes an actuator body including piezoelectric elements; and driver elements attached to the actuator body. The vibrator actuator is arranged so that the driver elements contact the relatively-movable member. In the drive unit, vibration is generated in the actuator body to generate elliptical motion of the driver elements in response to such vibration, thereby relatively moving the relatively-movable member or the vibratory actuator.

In this manner, the vibratory actuator outputs drive force through friction force between the driver elements and the relatively-movable member, and therefore there is a problem of abrasion on a surface of the relatively-movable member, which contacts the driver elements. On the other hand, if the contact surface is mirror-finished to reduce the abrasion on the contact surface, chattering noise is generated between the driver elements and the contact surface, and such a state is not preferred in practical use.

In a drive unit disclosed in Japanese Patent Publication No. 09-331687, streaks are formed by polishing in a surface of a relatively-movable member, which contacts driver elements, so that an average center line roughness (Ra) of the contact surface is equal to or greater than 0.05 μm, and equal to or less than 1.0 μm. This reduces abrasion on the contact surface while reducing generation of chattering noise on the contact surface.

SUMMARY

As described above, in the drive unit in which the drive force is output through the friction force between the driver elements and the relatively-movable member, there is a problem of occurrence of adhesion to the contact surface. There are microscopic raised and recessed portions on the contact surface, but extremely-high pressure acts on the raised portions of the raised and recessed portions, resulting in plastic deformation of the raised portions, and generation of abrasion powder by abrasion of the raised portions. Pressure further acts on the plastically-deformed portions and the abrasion powder, thereby causing adhesion of the plastically-deformed portions and the abrasion powder to the contact surface. When the adhesion is caused, a friction coefficient becomes excessively higher, and a drive capability is significantly degraded.

In the drive unit disclosed in Japanese Patent Publication No. H09-331687, the surface roughness of the contact surface is specified to reduce the abrasion on the contact surface, but it is insufficient for reducing the adhesion.

However, as described above, if the contact surface is mirror-finished to remove the raised portions from the contact surface, the noise is generated between the driver elements and the contact surface, and such a state is not preferred in practical use.

The present disclosure has been made in view of the foregoing, and it is an object of the present disclosure to reduce the noise generation and the occurrence of the adhesion.

A drive unit of the present disclosure includes a vibratory actuator including an actuator body generating vibration, and diver elements attached to the actuator body to output drive force by generating orbit motion in response to the vibration of the actuator body; and a relatively-movable member contacting the driver elements, and relatively moving with respect to the vibratory actuator. The relatively-movable member has a surface which contacts the driver elements, and the surface has smoothed portions and recessed portions which are recessed with respect to the smoothed portions.

According to the drive unit, the recessed portions allow the contact surface to have a proper roughness, whereas the smoothed portions allow the contact surface to have a shape with a smaller area of raised portions. Consequently, the noise generation on the contact surface can be reduced while reducing the occurrence of the adhesion to the contact surface.

BRIEF DESCRIPTION OF THE DRAWINGS

FIG. 8(A) illustrates a state before the driving; FIG. 8(B) illustrates a state in which the actuator body is expanded in a longitudinal direction to drive the movable body with one of driver elements; and FIG. 8(C) illustrates a state in which the actuator body is contracted in the longitudinal direction to drive the movable body with the other driver element.

FIG. 9(A) illustrates a conventional contact surface; and FIG. 9(B) illustrates a contact surface of the embodiment.

DETAILED DESCRIPTION

Embodiments of the present disclosure will be described as examples hereinafter with reference to the drawings.

Embodiments of the Present Disclosure

Figure 1:
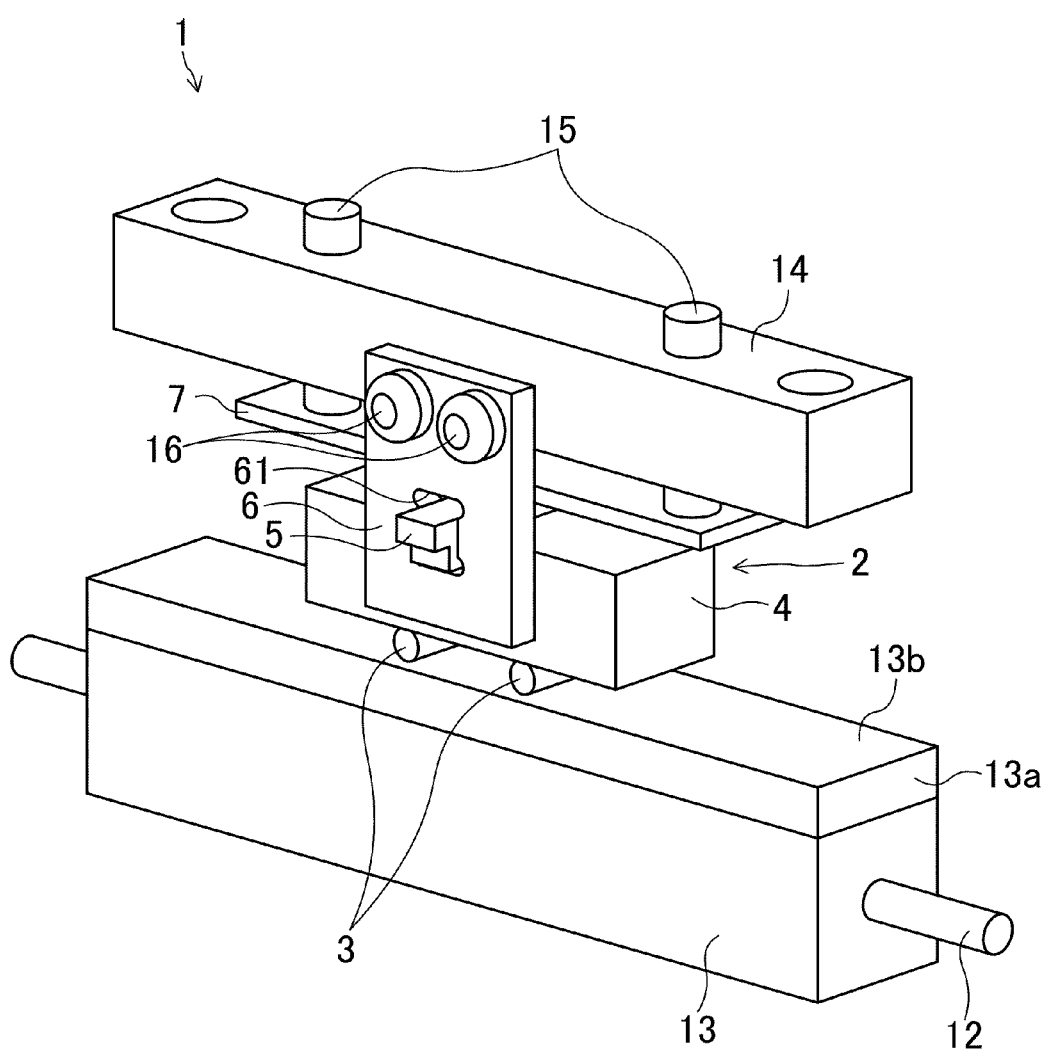
FIG. 1 is a perspective view of a drive unit of an embodiment of the present disclosure.
Figure 2:
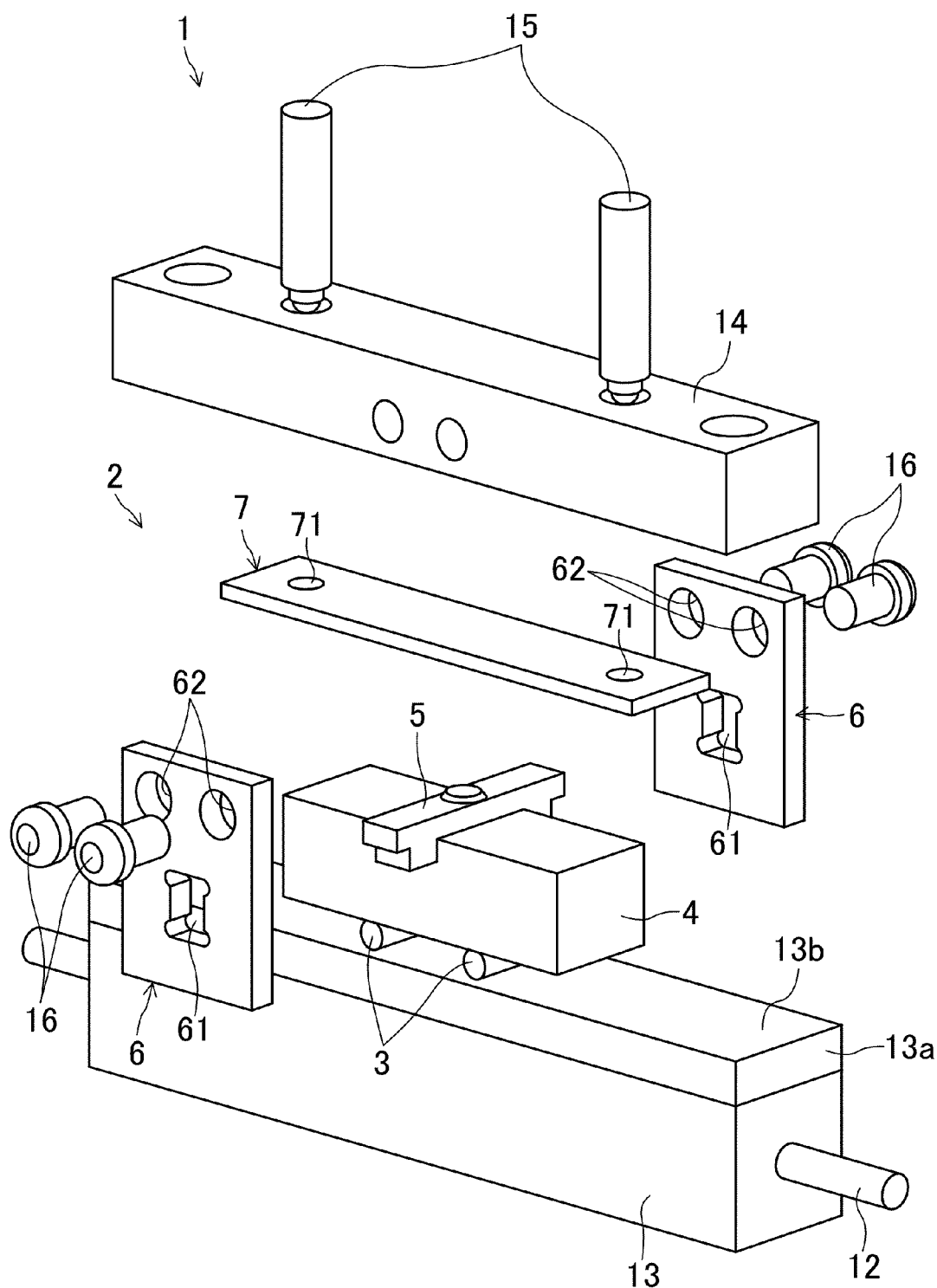
FIG. 2 is an exploded perspective view of the drive unit.

FIG. 1 is a perspective view of a drive unit 1 of an embodiment of the present disclosure, and FIG. 2 is an exploded perspective view of the drive unit 1. The drive unit 1 includes a movable body 13; an ultrasonic actuator 2; and a control unit (not shown in the figure) for driving and controlling the ultrasonic actuator 2.

The movable body 13 is slidably attached to a guide 12 fixed on a base (not shown in the figure) which is a fixed body. That is, the movable body 13 can move along a direction in which the guide 12 extends. The direction in which the guide 12 extends is a movable direction of the movable body 13. A contact member 13a made of alumina is bonded to the movable body 13. Material of the contact member 13a bonded to the movable body 13 is not limited to alumina, and the contact member 13a may be formed by using any material. The ultrasonic actuator 2 is arranged so that driver elements 3 (described later) contact a contact surface 13b of the contact member 13a. The movable body 13 serves as a relatively-movable member which receives drive force generated from the ultrasonic actuator 2, thereby relatively moving with respect to the ultrasonic actuator 2.

The ultrasonic actuator 2 includes, as illustrated in FIGS. 1 and 2, an actuator body 4 generating vibration, the driver elements 3 attached to the actuator body 4 to transmit the drive force of the actuator body 4 to the movable body 13; a holder 5 for holding the actuator body 4; supports 6 for supporting the holder 5; and a plate spring 7 for biasing the actuator body 4 toward the movable body 13. The ultrasonic actuator 2 serves as a vibratory actuator.

The actuator body 4 includes piezoelectric elements. The actuator body 4 is substantially in the form of a rectangular parallelepiped, and has a pair of substantially rectangular principal surfaces facing each other; a pair of long-side surfaces facing each other and extending in a longitudinal direction of the principal surfaces so as to be orthogonal to the principal surfaces; and a pair of short-side surfaces facing each other and extending in a lateral direction of the principal surfaces so as to be orthogonal to both of the principal surfaces and the long-side surfaces.

Figure 3:
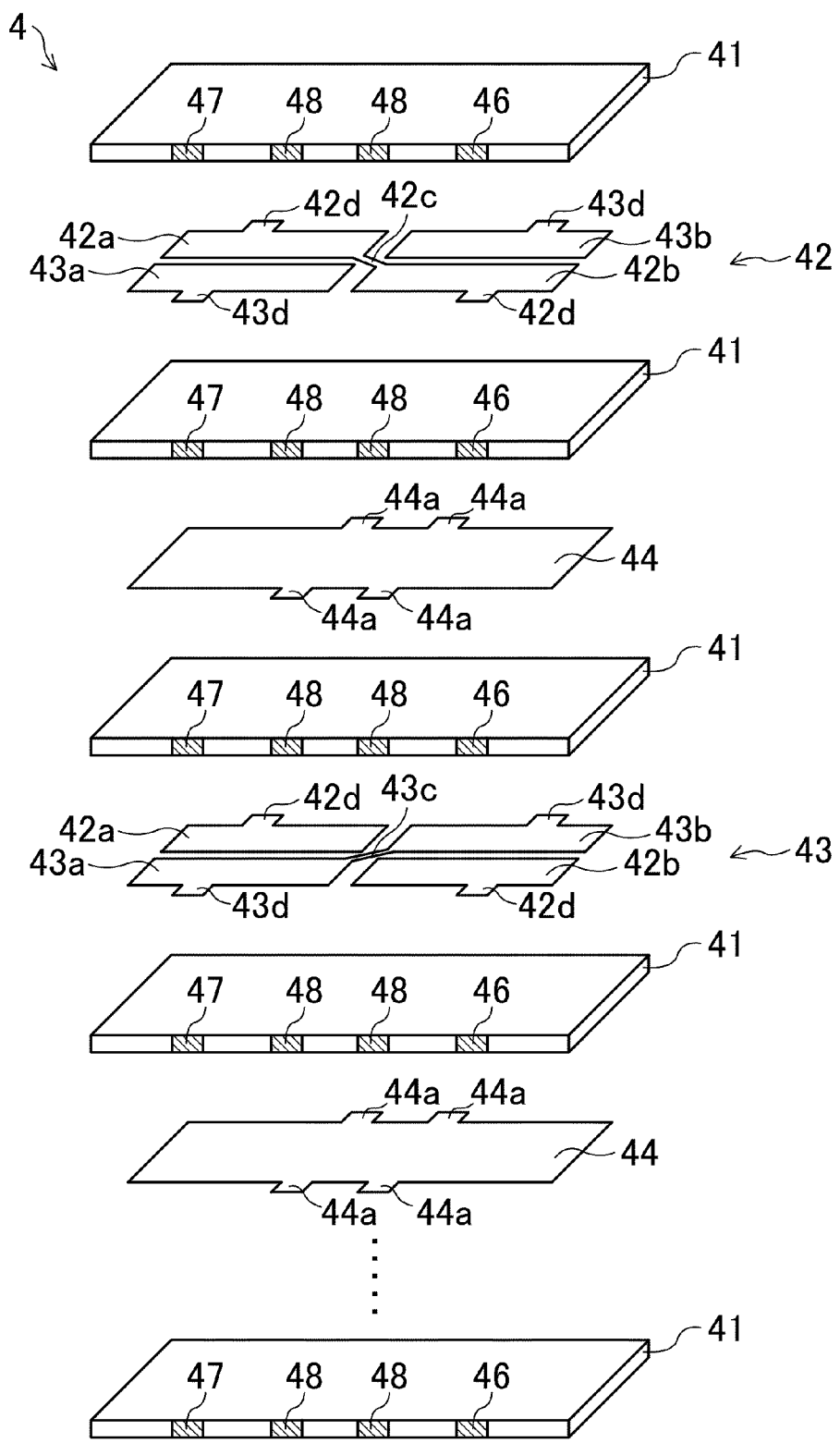
FIG. 3 is an exploded perspective view of an actuator body.

FIG. 3 is an exploded perspective view of the actuator body 4. As illustrated in FIG. 3, the actuator body 4 is provided by alternately stacking piezoelectric layers (piezoelectric elements) 41 and internal electrode layers 42, 44, 43 and 44. The internal electrode layers 42, 44, 43 and 44 are a first power-feeding electrode layer 42, a common electrode layer 44, a second power-feeding electrode layer 43, and a common electrode layer 44, which are alternately stacked in this order with the piezoelectric layers 41 being interposed therebetween. The first power-feeding electrode layer 42, the common electrode layer 44, the second power-feeding electrode layer 43, and the common electrode layer 44 are grouped as a single set, and a plurality of sets, each of which includes the internal electrode layers 42, 44, 43, and 44, are repeatedly stacked with the piezoelectric layers 41 being interposed therebetween. Note that the piezoelectric layers 41 are positioned at both ends of the actuator body 4 in the stacking direction. Each of the first power-feeding electrode layer 42, the second power-feeding electrode layer 43, and the common electrode layers 44 is printed on a principal surface of each of the piezoelectric layers 41.

Each of the piezoelectric layers 41 is an insulating layer made of ceramic such as lead zirconate titanate. As in the actuator body 4, the piezoelectric layer 41 is substantially in the form of a rectangular parallelepiped, and has a pair of principal surfaces; a pair of long-side surfaces; and a pair of short-side surfaces. Each of the long-side surfaces of the piezoelectric layer 41 is provided with first and second external electrodes 46 and 47 in both end portions in the longitudinal direction, and two common external electrodes 48 are formed on an inner side in the longitudinal direction with respect to the first and second external electrodes 46 and 47. That is, in each of the long-side surfaces of the piezoelectric layer 41, the first external electrode 46, the two common external electrodes 48, and the second external electrode 47 are arranged so as to be apart from each other in the longitudinal direction in this order.

Each of the common electrode layers 44 is substantially rectangular, and covers almost all the principal surface area of the piezoelectric layer 41. Lead electrodes 44a are formed so as to extend from long-side sections of the common electrode layer 44 to the common external electrodes 48 formed in the long-side surfaces of the piezoelectric layer 41.

Figure 4:
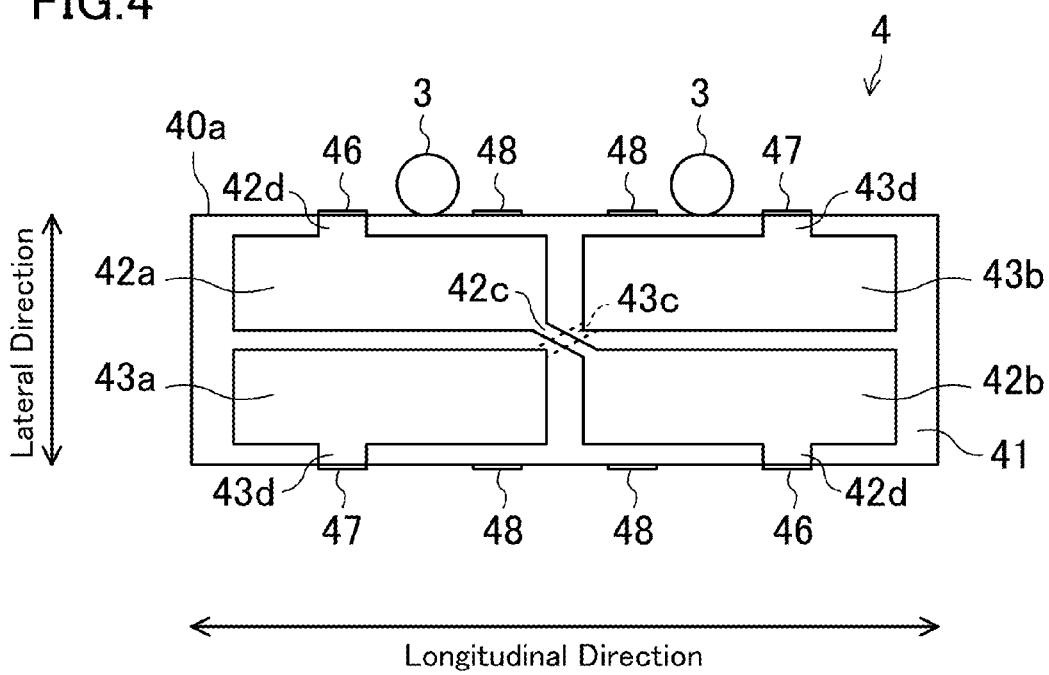
FIG. 4 is a front view schematically illustrating a configuration of the actuator body.

As illustrated in FIG. 4, the principal surface of the piezoelectric layer 41 is divided into quadrants, i.e., two areas in the longitudinal direction and two areas in the lateral direction. The first power-feeding electrode layer 42 includes a pair of first electrodes 42a and 42b respectively formed on one of pairs of diagonally-aligned areas of the principal surface, and the second power-feeding electrode layer 43 includes a pair of second electrodes 43a and 43b formed on the other pair of diagonally-aligned areas. The first electrodes 42a and 42b and the second electrodes 43a and 43b face the common electrode layer 44 with the piezoelectric layer 41 being interposed therebetween. In the first power-feeding electrode layer 42, the first electrodes 42a and 42b are placed in conduction through a first conduction electrode 42c. In addition, in the second power-feeding electrode layer 43, the second electrodes 43a and 43b are placed in conduction through a second conduction electrode 43c. Lead electrodes 42d are formed so as to extend from the first electrodes 42a and 42b to the first external electrodes 46 formed in adjacent portions of the long-side surfaces of the piezoelectric layer 41. Lead electrodes 43d are formed so as to extend from the second electrodes 43a and 43b to the second external electrodes 47 formed in adjacent portions of the long-side surfaces of the piezoelectric layer 41.

In each of the long-side surfaces of the actuator body 4 provided by alternately stacking the piezoelectric layers 41 and the internal electrode layers 42, 44, 43 and 44, the common external electrodes 48 of the piezoelectric layers 41 are aligned in the stacking direction to function as a single external electrode. The lead electrodes 44a formed in the common electrode layers 44 are electrically connected to the common external electrodes 48. The common electrode layers 44 provided in the different piezoelectric layers 41 are placed in conduction through the common external electrodes 48.

In the similar manner, in each of the long-side surfaces of the actuator body 4, the first external electrodes 46 of the piezoelectric layers 41 are aligned in the stacking direction to function as a single external electrode, and the second external electrodes 47 of the piezoelectric layers 41 are aligned in the stacking direction to function as a single external electrode. The lead electrodes 42d extending from the first electrodes 42a and 42b are electrically connected to the first external electrodes 46. In addition, the lead electrodes 43d extending from the second electrodes 43a and 43b are electrically connected to the second external electrodes 47. In this manner, the first electrodes 42a and 42b, and the first electrodes 42a and 42b provided in the different piezoelectric layers 41 are placed in conduction through the first conduction electrode 42c and the first external electrodes 46. In addition, the second electrodes 43a and 43b, and the second electrodes 43a and 43b provided in the different piezoelectric layers 41 are placed in conduction through the second conduction electrode 43c and the second external electrodes 47. Signal lines from the control unit are connected to the external electrodes 46, 47, and 48. Power is fed to the actuator body 4 through the external electrodes 46, 47, and 48.

Two driver elements 3 are attached to a long-side surface (i.e., one of a pair of surfaces facing each other along a direction of bending vibration (described later), which is hereinafter referred to as an "installation surface") 40a of the actuator body 4.

The driver elements 3 are cylindrical members, and are made of, e.g., zirconia, alumina, silicon nitride, silicon carbide, and tungsten carbide. The driver elements 3 are arranged so that an axial direction thereof is along a thickness direction of the actuator body 4. The driver elements 3 are attached to the installation surface 40a with adhesive so as to be in linear contact with the installation surface 40a. The adhesive is preferably softer than the material of the actuator body 4 and the material of the driver elements 3. Specifically, the adhesive includes, in particular, synthetic resin such as epoxy resin and silicone resin. Such material is used to possibly reduce interference with vibration (described later) of the actuator body 4, thereby ensuring fixing between the driver elements 3 and the installation surface 40a.

The driver elements 3 are attached to the installation surface 40a at a distance of 30-35% of the length of the installation surface 40a inwardly from both ends of the actuator body 4 in the longitudinal direction, i.e., at positions corresponding to antinodes of second-order bending vibration (described later) of the actuator body 4, where the maximum vibration occurs.

In the actuator body 4 configured as described above, the common external electrodes 48 are connected to ground to apply AC voltages having predetermined frequencies to the first and second external electrodes 46 and 47 with their phases being offset by 90°, thereby applying the AC voltages which are 90° out of phase with each other, to the pair of first electrodes 42a and 42b and the other pair of second electrodes 43a and 43b, which are positioned on the diagonal lines of the principal surface of the piezoelectric layer 41. Consequently, longitudinal vibration in the longitudinal direction of the actuator body 4 (i.e., a so-called "expanding/contracting" vibration) and bending vibration in the lateral direction (i.e., a so-called "lateral" vibration) are induced.

Figure 5:
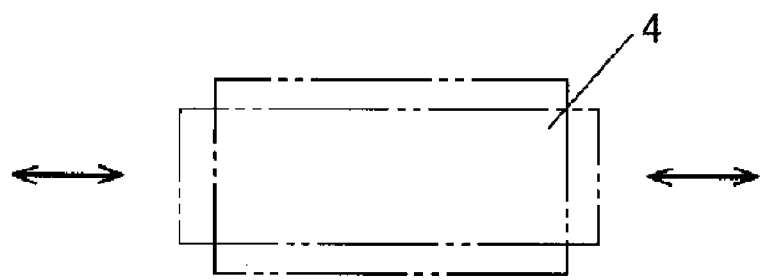
FIG. 5 is a conceptual diagram illustrating displacement of the actuator body by first-order expanding/contracting vibration.
Figure 6:
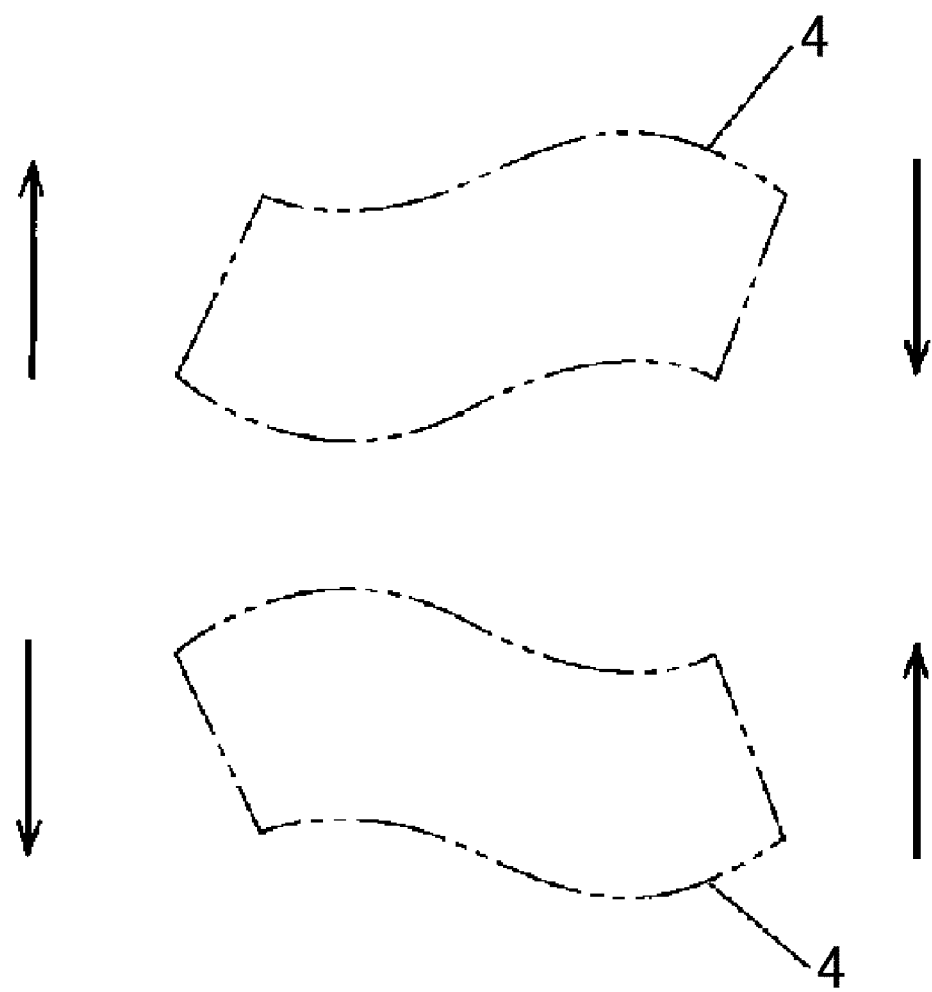
FIG. 6 is a conceptual diagram illustrating displacement of the actuator body by second-order bending vibration.
Figures 7A, 7B, 7C, 7D:
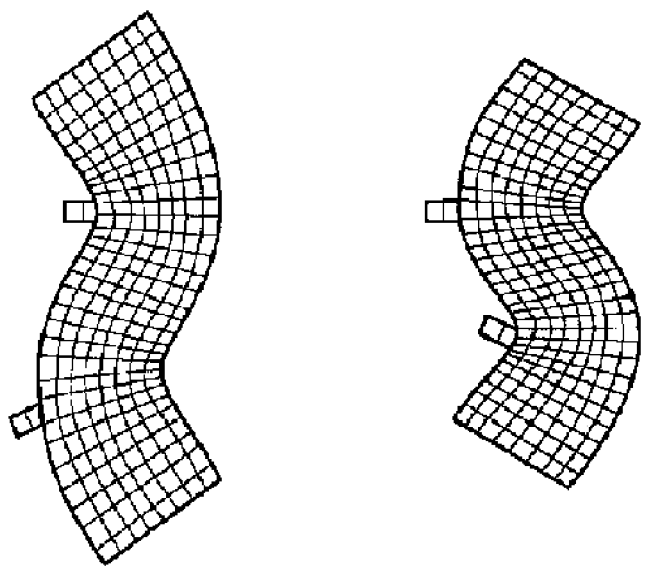
FIGS. 7(A)-7(D) are conceptual diagrams illustrating displacement of the actuator body by composite vibration of the first-order expanding/contracting vibration and the second-order bending vibration.

Resonance frequencies of the longitudinal and bending vibrations are determined by the actuator body 4, i.e., the material, shape, etc. of the actuator body 4. The resonance frequencies are also varied depending on force supporting the actuator body 4 and positions at which the actuator body 4 is supported. Considering the above-described conditions, the resonance frequencies are adjusted so as to be substantially equal to each other, and AC voltages having a frequency around the adjusted resonance frequency are applied to the first and second external electrodes 46 and 47 with their phases being offset by 90°. For example, if the shape etc. of the actuator body 4 is designed such that the first-order longitudinal vibration (see FIG. 5) and the second-order bending vibration (see FIG. 6) have the same resonance frequency, and AC voltages having a frequency around the resonance frequency are applied with their phases being offset by 90° as described above, the first-order longitudinal vibration and the second-order bending vibration occur in harmony in the actuator body 4. Thus, the shape of the actuator body 4 is varied in the order illustrated in FIGS. 7(A), 7(B), 7(C), and 7(D).

Consequently, the driver elements 3 attached to the actuator body 4 provide substantially elliptical motion, i.e., orbit motion, on a plane parallel to the principal surface of the actuator body 4 (a plane parallel to the plane of the page of FIG. 7), i.e., a plane containing the longitudinal and lateral directions (in other words, a plane containing directions of the longitudinal and bending vibrations).

The actuator body 4 configured as described above has a plurality of antinodes of vibration. The term "antinodes of vibration" refers to points where the maximum vibration displacement occurs. In the present embodiment, there are two antinodes of the longitudinal vibration positioned at the short-side surfaces of the actuator body 4. In addition, there are eight antinodes of the bending vibration including four antinodes at end portions of one of the long-side surfaces of the actuator body 4, and at end portions of the other long-side surface; and four antinodes at a distance of 30-40% of the longitudinal length of the actuator body 4 inwardly from the end portions of the one of the long-side surfaces, and from the end portions of the other long-side surface. That is, in the ultrasonic actuator 2, there are ten antinodes of vibration including the antinodes of the expanding/contracting and bending vibrations. The driver elements 3 are attached to the installation surface 40a which is one of the long-side surfaces, at the points corresponding to the antinodes, i.e., at a distance of 30-35% of the length of the installation surface 40a inwardly from the both end portions in the longitudinal direction.

The holder 5 is made of polycarbonate (containing glass fibers). As illustrated in FIGS. 1 and 2, the holder 5 is attached to the long-side surface of the actuator body 4, to which the driver elements 3 are not attached. Specifically, at a center portion of the long-side surface of the actuator body 4 in the longitudinal direction, the holder 5 is attached so as to sandwich the actuator body 4 in the thickness direction of the actuator body 4. The center portion of the long-side surface of the actuator body 4 in the longitudinal direction is a portion corresponding to a node of the longitudinal vibration of the actuator body 4. In addition, the holder 5 outwardly protrudes with respect to the actuator body 4 in the thickness direction of the actuator body 4.

The support 6 is formed in a plate-like shape. The supports 6 are attached to a base member 14 fixed to the base. Specifically, two through-holes 62 are formed through the support 6 in the thickness direction of the support 6. The support 6 is attached to the base member 14 with screws 16 inserted into the through-holes 62. In addition, at the center of the support 6, an opening 61 for supporting the holder 5 is formed through the support 6 in the thickness direction of the support 6. An end portion of the holder 5, which protrudes in the thickness direction of the actuator body 4, is inserted into the opening 61. Depending on the length of the end portion of the holder 5, which outwardly protrudes with respect to the actuator body 4, the opening 61 may not penetrate the support 6. In this manner, the actuator body 4 to which the holder 5 is attached is supported by the supports 6. The actuator body 4 is supported by the supports 6 with the driver elements 3 contacting the contact surface 13*b* of the movable body 13. The opening 61 has a long hole shape extending in the lateral direction of the actuator body 4, and the holder 5 can move in the opening 61 along an edge of the long hole shape. Thus, the actuator body 4 is supported by the supports 6 so as to be movable in the lateral direction of the actuator body 4.

The plate spring 7 is provided so as to face the long-side surface of the actuator body 4, to which the holder 5 is attached. Specifically, the plate spring 7 is provided between the long-side surface of the actuator body 4, to which the holder 5 is attached, and the base member 14. At both end portions of the plate spring 7 in the longitudinal direction, openings 71 are formed, into which the tips of screws 15 inserted into the base member 14 are fitted. Specifically, screw holes are formed through the base member 14 in a direction parallel to the lateral direction of the actuator body 4, and the screws 15 are inserted into the screw holes. The tips of the screws 15 protrude to the actuator body 4 side with respect to the base member 14. The tips of the screws 15, which protrude to the actuator body 4 side with respect to the base member 14 are fitted into the openings 71 of the plate spring 7. The plate spring 7 configured as described above contacts the holder 5 attached to the actuator body 4 at a center portion thereof in the longitudinal direction. That is, the screws 15 of the base member 14 protrude to the actuator body 4 side, thereby allowing the plate spring 7 to push the actuator body 4 toward the movable body 13 side through the holder 5.

Next, assembly of the ultrasonic actuator 2 will be described.

First, the holder 5 is bonded to the center portion of the long-side surface of the actuator body 4 in the longitudinal direction, to which the driver elements 3 are not attached. Then, one of the supports 6 is attached to the base member 14 with the screws 16. Subsequently, one of the end portions of the holder 5 attached to the actuator body 4 is inserted into the opening 61 of the support 6, and then the other end portion of the holder 5 is inserted into the opening 61 of the remaining support 6. Then, the remaining support 6 is attached to the base member 14 with the screws 16. In this manner, the actuator body 4 is supported by the supports 6. Subsequently, the plate spring 7 is arranged between the actuator body 4 and the base member 14. The screws 15 are inserted into the screw holes of the base member 14, and the tips of the screws 15 are fitted into the openings 71 of the plate spring 7. In such a state, the screws 15 is further protruded to the actuator body 4 side to push the holder 5 by the plate spring 7, thereby biasing the actuator body 4 toward the movable body 13 side. Consequently, the driver elements 3 are pushed against the movable body 13.

The signal lines extending from the control unit are connected to the external electrodes 46, 47, and 48 of the ultrasonic actuator 2 assembled as described above.

When receiving an operation command from an external unit, the control unit applies AC voltages having frequencies corresponding to the operation command, to the first and second external electrodes 46 and 47 so as to have a phase difference corresponding to the operation command. In this manner, the control unit harmonically generates the longitudinal and bending vibrations in the actuator body 4 to provide the orbit motion of the driver elements 3 as illustrated in FIGS. 7, thereby moving the movable body 13. More specifically, the control unit applies AC voltages having frequencies slightly higher than a common resonance frequency for the longitudinal and bending vibrations of the actuator body 4, to the first and second external electrodes 46 and 47 in order to prevent abnormal heat generation in the actuator body 4. In such a state, the AC voltages are applied to the first and second external electrodes 46 and 47 with their phases being offset by 90°.

When generating composite vibration of the longitudinal and bending vibrations by the actuator body 4, the driver elements 3 provide the substantially elliptical motion in the plane containing the longitudinal and lateral directions of the actuator body 4. Thus, while the driver elements 3 periodically repeat an increase/decrease in friction force between the driver elements 3 and the contact surface 13*b* of the movable body 13, the drive force of the actuator body 4 in the longitudinal direction is provided to the movable body 13 through the friction force, thereby moving the movable body 13 along the guide 12. The longitudinal direction of the actuator body 4 (direction coincident with the direction in which the guide 12 extends) is equivalent to a drive direction in which the driver elements 3 output the drive force.

Driving of the movable body 13 by the ultrasonic actuator 2 will be described in more detail hereinafter with reference to FIG. 8. When expanding the actuator body 4 in the longitudinal direction (direction of the longitudinal vibration), one of the driver elements 3 (e.g., the driver element 3 on the left side as viewed in FIG. 8) is displaced while increasing the friction force between the driver element 3 and the contact surface 13*b* of the movable body 13 as compared to the friction force before the driving of the ultrasonic actuator 2 (i.e., the friction force in a state in which the driver elements 3 simply contact the contact surface 13*b* of the movable body 13) as illustrated in FIG. 8(B). Thus, such friction force moves the movable body 13 toward a side to which the one of the driver elements 3 is displaced in the longitudinal direction (the left side as viewed in FIG. 8). In such a state, the other driver element 3 (the driver element 3 on the right side as viewed in FIG. 8) is oppositely displaced from the former driver element 3 in the longitudinal direction. However, such a driver element 3 is displaced apart from the movable body 13, or is displaced while decreasing the friction force between the driver element 3 and the contact surface 13*b* of the movable body 13 as compared to the friction force before the driving of the ultrasonic actuator 2. Thus, the latter driver element 3 has little effect on the movement of the movable body 13.

Figure 8A:
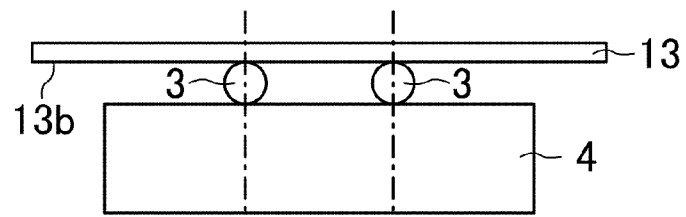
FIGS. 8(A)-8(C) are conceptual diagrams illustrating driving of a movable body by an ultrasonic actuator.
Figure 8B:
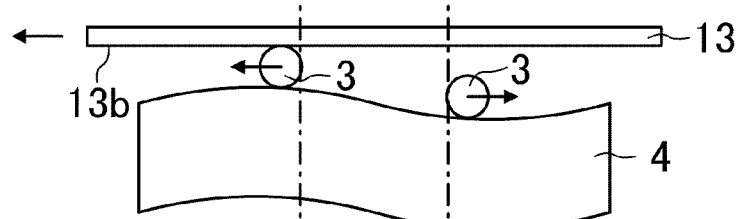
Figure 8C:
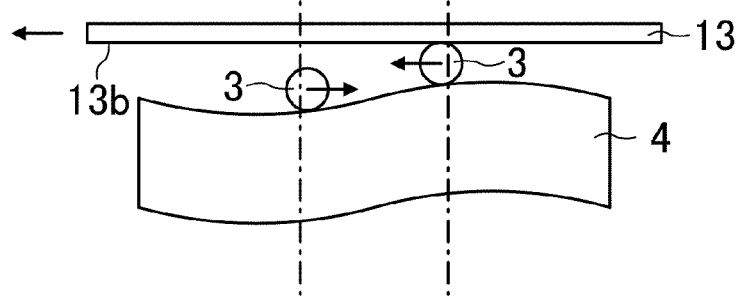

On the other hand, when contracting the actuator body 4 in the longitudinal direction, the latter driver element 3 (the driver element 3 on the right side as viewed in FIG. 8) is displaced while increasing the friction force between the driver element 3 and the contact surface 13*b* of the movable body 13 as compared to the friction force before the driving of the ultrasonic actuator 2 (i.e., the friction force in the state in which the driver elements 3 simply contact the contact surface 13*b* of the movable body 13) as illustrated in FIG. 8(C). Thus, such friction force moves the movable body 13 toward a side to which the latter driver element 3 is displaced in the longitudinal direction (the left side as viewed in FIG. 8). Such a movement direction is the same as the above-described movement direction of the movable body 13 by the latter driver element 3 when expanding the actuator body 4. In such a state, the former driver element 3 (the driver element 3 on the left side as viewed in FIG. 8) is oppositely displaced from the latter driver element 3 in the longitudinal direction. However, such a driver element 3 is displaced apart from the movable body 13, or is displaced while decreasing the friction force between the driver element 3 and the contact surface 13*b* of the movable body 13 as compared to the friction force before the driving of the ultrasonic actuator 2. Thus, the former driver element 3 has little effect on the movement of the movable body 13.

In FIG. 8, the driver element 3 having no effect on the movement of the movable body 13 is apart from the movable body 13, but is not necessarily apart from the movable body 13. That is, the driver element 3 may contact the movable body 13 with the friction force which does not allow the movement of the movable body 13.

As described above, the driver elements 3 alternately move the movable body 13 in a predetermined direction with their phases being offset by 180°. The AC voltages are applied to the first and second external electrodes 46 and 47 with their phases being offset by −90° to reverse the direction of the drive force output from the driver elements 3, thereby allowing the movable body 13 to move in the other direction.

The contact surface 13b will be described in more detail below.

The contact surface 13b is generally processed by mechanical lapping using a flat surface lapping machine and loose grains. A certain degree of flatness and parallelism having no significant waviness on an attachment reference surface (a surface on an opposite side of the contact surface 13b) are required for the contact surface 13b. However, as for the flatness and the parallelism, as long as the contact surface 13b is processed with precision on the order of approximately several μm to 10 μm by surface grinding which is a first process, the flatness and the parallelism are not significantly changed in subsequent processes, thereby not causing major problems. The most significant problem is a surface shape after the final finish.

Figure 9A:
FIGS. 9(A) and 9(B) are schematic cross-sectional views of contact surfaces.

Typically, when performing a general lapping process using loose grains, a contact surface has a raised/recessed surface shape as illustrated in FIG. 9(A). A value of the average center line roughness (Ra) in such a state is generally determined depending on the size of loose grains to be used, and grain types, and the value of the average center line roughness (Ra) can be properly controlled.

However, the surface formed by such a typical lapping process certainly has a raised/recessed section. When the driver elements 3 contact raised portions of the raised/recessed section to act significantly-high pressure thereon, the raised portions are plastically deformed, or are abraded to generate abrasion powder. Consequently, the plastically-deformed portions and the abrasion powder are adhered to the contact surface 13b. The section where the adhesion is caused has an extremely-high friction coefficient as compared to a section where the adhesion is not caused, thereby significantly degrading a drive capability.

As in the present embodiment, e.g., if the driver elements 3 are formed in the cylindrical shape, and the driver elements 3 are attached to the long-side surface of the actuator body 4 so that the axis thereof is along the thickness direction of the actuator body 4, the adhesion is unlikely to be uniformly caused across an entire area along the axial direction of the driver elements 3, and is likely to be caused in a part of the area along the axial direction of the driver elements 3. When entering such a state, the driver elements 3 do not uniformly contact the contact surface 13b across the entire area along the axial direction thereof, but partially contact the contact surface 13b. Then, the pressure acting on the raised portions of the contact surface 13b is further increased, thereby more easily causing the adhesion. Consequently, the area where the adhesion is caused is further expanded, thereby significantly degrading the drive capability of the ultrasonic actuator 2.

In addition, if great thrust force is required, a technique for increasing the biasing force of the plate spring 7 toward the actuator body 4 is used. However, particularly in such a case, the adhesion is easily caused.

Further, when stopping the movable body 13, the power supply may not be stopped, but only the bending or expanding/contracting vibration may be generated in the actuator body 4. That is, in order to stop the movable body 13, the driver elements 3 may be vibrated only in a normal direction of the contact surface 13b of the movable body 13. In such a case, the driver elements 3 repeatedly vibrate while contacting the same portion of the contact surface 13b. In addition to the above, the pressure acting on the contact surface 13b is further increased, thereby more easily causing the adhesion.

Figure 9B:
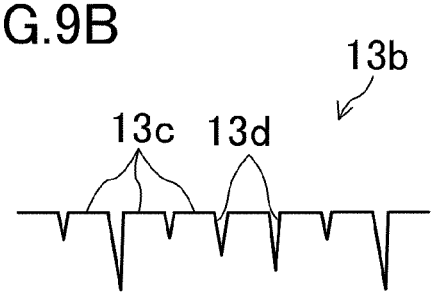

On the other hand, in the present embodiment, the contact surface 13b of the movable body 13 has a surface shape as illustrated in FIG. 9(B). That is, the contact surface 13b has smoothed portions 13c and recessed portions 13d. This reduces the adhesion of the abrasion powder to the contact surface 13b. In addition, the noise generation can be also reduced. The widths of the smoothed portion 13c and of the recessed portion 13d are at least narrower than the width of the driver element 3 (specifically, the width of the driver element 3 in the drive direction), i.e., more microscopic as compared to the width of the driver element 3. Further, it is preferred that the smoothed portions 13c and the recessed portions 13d are randomly located.

Comparison of drive capabilities relating to contact surfaces 13b having various surface shapes will be described below.

The contact surface 13b is formed by the following method. First, the contact member 13a is processed by the flat surface lapping machine so that the parallelism of the contact member 13a and the flatness of the contact surface 13b fall within a predetermined range. Subsequently, the contact surface 13b is lapped by using loose grains having a coarse grain size, e.g., diamond grains of approximately #100-1000. In such a state, shallow and deep scratches are randomly interleaved in the contact surface 13b, and therefore various raised and recessed portions are randomly interleaved in the contact surface 13b. Next, final lapping of the contact surface 13b is performed by using microscopic diamond grains of approximately #15000 resulting in a small amount of grinding e.g., diamond grains (loose grains) having an average grain size of approximately 1 μm. The diamond having the average grain size of 1 μm results in an extremely small amount of grinding, and therefore top portions of the raised portions of the raised/recessed section of the contact surface 13b are mainly processed. That is, after the polishing of the contact surface 13b with coarse grains, the contact surface 13b is lapped with fine grains which do not remove the recessed portions formed upon the polishing. Consequently, as illustrated in FIG. 9(B), the contact surface 13b has the surface shape in which the smoothed portions 13c are interleaved with the recessed portions 13d. That is, the width of the recessed portion 13d is approximately the same as the grain size of the coarse grains used in the initial lapping. The width of the raised portion to be processed into the smoothed portion 13c is also approximately the same as the grain size of the coarse grains used in the initial lapping. Thus, the width of the smoothed portion 13c is also approximately the same as the grain size of the coarse grains used in the initial lapping.

The ratio of the smoothed portions 13c to the recessed portions 13d in the contact surface 13b can be changed by adjusting the degree of the final lapping, e.g., processing time.

The contact surface 13b is lapped with the diamond grains of approximately #100-1000, which has the average grain size of approximately 1 μm, but such lapping is not limited to the above. As long as the contact surface 13b which has the smoothed portions 13c and the recessed portions 13d can be formed, a different combination of grains having different grain sizes may be employed. Also, GC grains or WA grains may be employed.

Figure 10:
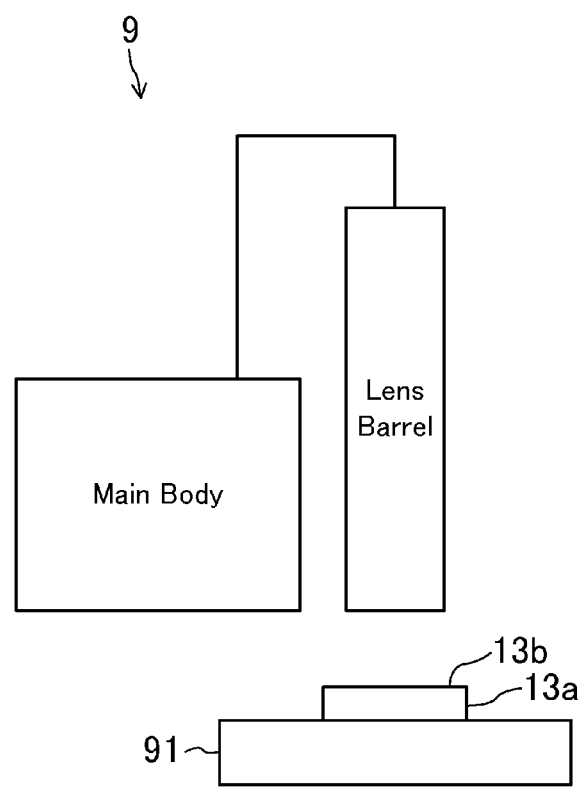
FIG. 10 is a view schematically illustrating an imaging device for acquiring an image of the contact surface.
Figure 11A:
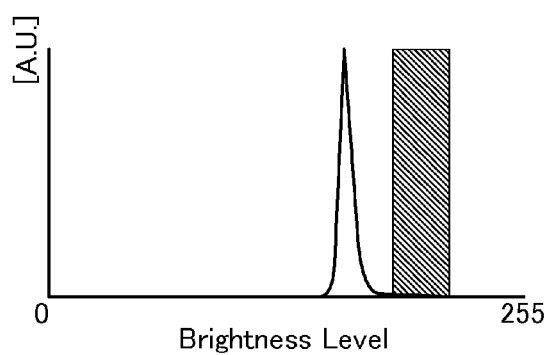
FIG. 11(A) is a brightness distribution of a contact surface with a smoothing parameter of 1%.
Figure 11B:
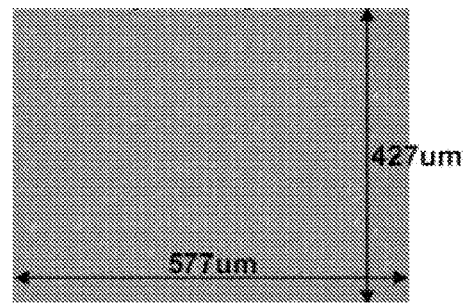
FIG. 11(B) is a surface image thereof.
Figure 12A:
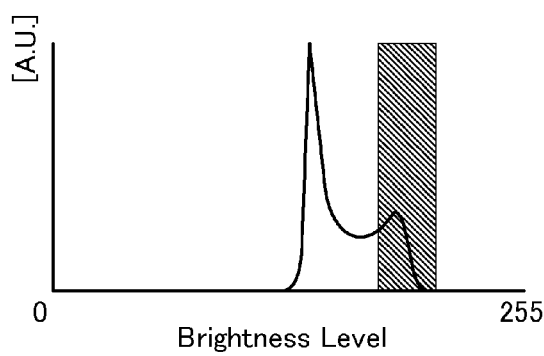
FIG. 12(A) is a brightness distribution of a contact surface with a smoothing parameter of 15%.
Figure 12B:
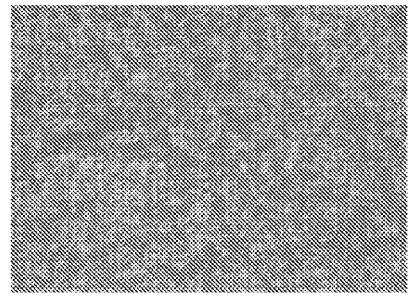
FIG. 12(B) is a surface image thereof.
Figure 13A:
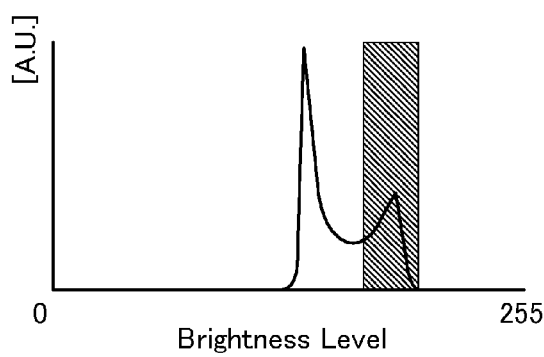
FIG. 13(A) is a brightness distribution of a contact surface with a smoothing parameter of 20%.
Figure 13B:
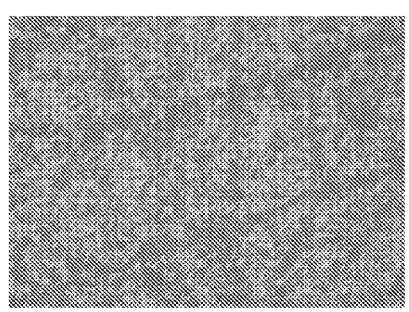
FIG. 13(B) is a surface image thereof.
Figure 14A:
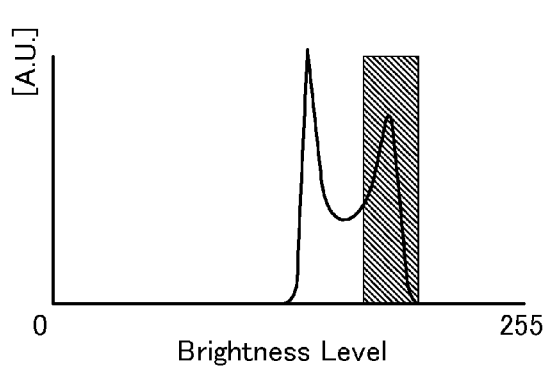
FIG. 14(A) is a brightness distribution of a contact surface with a smoothing parameter of 30%.
Figure 14B:
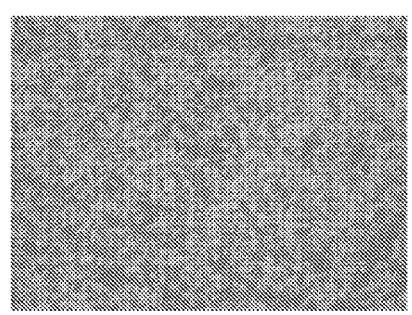
FIG. 14(B) is a surface image thereof.

Here, a smoothing parameter is used as an index representing the ratio of the smoothed portions 13c to the recessed portions 13d in the contact surface 13b. The smoothing parameter is obtained as follows. First, an image of the contact surface 13b is acquired by a microscope 9, and then a brightness distribution of the acquired image is obtained. Specifically, as illustrated in FIG. 10, the contact member 13a is installed on a stage 91. In such a state, the contact member 13a is installed so that the contact surface 13b is orthogonal to an optical axis of a lens barrel of the microscope 9. Then, the contact surface 13b is irradiated with light from a light source, and the reflected light, i.e., a surface image of the contact surface 13b is acquired by an imaging device of the microscope 9. The light from the light source is oriented in a direction coincident with the optical axis of the lens barrel, by a half mirror etc. provided in the lens barrel to irradiate the contact surface 13b. Since the direction of the incident light from the light source is coincident with the optical axis of the lens barrel, a portion of the contact surface 13b, in which a normal line is along an optical axis direction (an angle between the normal line and the optical axis is small), has a higher brightness level, whereas a portion in which the normal line is displaced from the optical axis direction (the angle between the normal line and the optical axis is large) has a lower brightness level. In the present embodiment, a microscope VHX-200 manufactured by Keyence Corporation is used. The brightness distribution of the acquired surface image is expressed at gradation levels of 0-255. The gradation level of "0" is equivalent to a brightness level of 0%, and the maximum brightness value (i.e., a value which is not the brightness level at the gradation level of "255," but is the maximum value of the acquired brightness distribution) is equivalent to a brightness level of 100%. Then, an area of a portion corresponding to the brightness level of 85-100% is obtained. In the present embodiment, the portion corresponding to the brightness level of 85-100% is equivalent to a smoothed portion, and the ratio of the area of the smoothed portion to an entire area of the portion of the contact surface 13b, the image of which is acquired, is the smoothing parameter.

FIGS. 11-14 illustrate brightness distributions and surface images of contact surfaces 13b with the smoothing parameters of 1%, 15%, 20%, and 30%. The contact surface 13b with the smoothing parameter of 1% is a surface formed by the conventional lapping technique. That is, such a contact surface 13b is a surface in which a raised/recessed section is uniformly formed with microscopic grains by the final lapping, and the brightness distribution mainly has a single peak value. The contact surface 13b with the smoothing parameter of 15%, 20%, or 30% is a surface which, by the final lapping, is formed with grains having a grain size much smaller than that in previous lapping, and the smoothed portions 13c are randomly interleaved with the recessed portions 13d. The brightness distribution of such a contact surface 13b has a relatively-high peak corresponding to the smoothed portion 13c, and a relatively-low peak corresponding to the recessed portion 13d. That is, the normal direction of the smoothed portion 13c is approximately coincident with the optical axis of the lens barrel of the microscope 9, i.e., the angle between the normal direction and the optical axis is small, resulting in an increase in brightness. On the other hand, the normal direction of the recessed portion 13d is appreciably displaced from the optical axis of the lens barrel of the microscope 9, i.e., the angle between the normal direction and the optical axis is large, resulting in a decrease in brightness. Consequently, the brightness distribution has the two relatively-high and relatively-low peaks. The relatively-high peak is contained in the area corresponding to the brightness level of 85%-100% when the gradation level of "0" in the brightness distribution is equivalent to the brightness level of 0%, and the maximum brightness value is equivalent to the brightness level of 100%. That is, the extent to which the portion corresponding to the smoothed portions 13c is contained can be determined depending on the ratio of the portion corresponding to the brightness level of 85%-100% to the area of the contact surface 13b.

Figure 15:
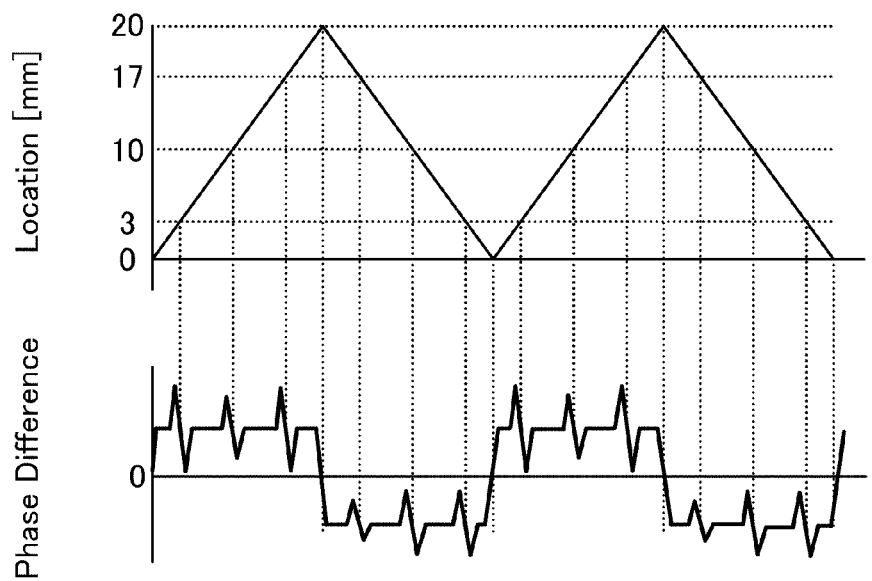
FIG. 15 is a graph illustrating a phase difference observed in an examination operation.

As for the contact surfaces 13b with various shapes, which are processed by the above-described method, the occurrence of the adhesion and the noise generation are examined as follows. First, the ultrasonic actuator 2 drives and reciprocates the movable body 13 under conditions where the adhesion can be caused (hereinafter referred to as a "test operation"). After the test operation, the ultrasonic actuator 2 drives and reciprocates the movable body 13 under conditions for examining whether or not the adhesion is caused (hereinafter referred to as an "examination operation"). In the test operation, under conditions where a stroke is 20 mm, the biasing force of the driver elements 3 toward the movable body 13 is 8N, and a traveling speed is 20 mm/s, a stop mode is performed, in which only the bending vibration is generated in the actuator body 4 (a phase difference between two AC voltages is 180°) at three points of 3 mm, 10 mm, and 17 mm during the stroke of 20 mm. In the examination operation, while generating the stroke of 20 mm at 8 mm/s, a phase difference between two AC voltages actually applied to the actuator body 4 is observed. When the phase difference is varied, it is determined that the adhesion is caused in portions contacting the driver elements 3 at such a point. If the adhesion is caused, a phase difference illustrated in FIG. 15 can be observed. FIG. 15 illustrates the phase difference between two AC voltages during two reciprocating strokes of 20 mm. In FIG. 15, the adhesion is caused at the points of 3 mm, 10 mm, and 17 mm during the stroke of 20 mm, thereby causing a phase difference variation.

In addition to the variation in phase difference, it is also examined whether or not noise is generated. The noise generation is determined depending on whether or not noise can be heard by ears.

As for the contact surface 13b lapped by a conventional lapping technique (e.g., a lapping technique in which the grain size is gradually reduced to #1000, #5000, and #15000), the occurrence of the adhesion and the noise generation are also examined.

A result thereof is illustrated in Table 1. In the table, the smoothing parameters are expressed in percentage. A first comparative example in Table 1 is for a contact surface 13b lapped by the conventional lapping technique. As for second and third comparative examples and first to eighth working examples, processing time, processing pressure, and processing speed in the final lapping with microscopic diamond grains are different. As shown in Table 1, the adhesion is not caused in a smoothing parameter range of 5-65%, and the adhesion is caused when the smoothing parameter is less than 5%. In addition, the adhesion is also caused in the contact surface 13b lapped by the conventional lapping technique. Further, when the smoothing parameter exceeds 65%, the contact surface 13b is a substantially mirrored surface, the contact between the driver elements 3 and the contact surface 13b generates noise. Such noise may be chattering noise generated due to friction of surfaces having the microscopic surface roughness. As described above, the appropriate smoothing parameter of the contact surface 13b is 5-60%.

| | Smoothing Parameter | Occurrence of Adhesion | Generation of Noise |
|---|---|---|---|
| 1st Comparative Example | 1% | Occurred | Not Generated |
| 2nd Comparative Example | 3% | Occurred | Not Generated |
| 1st Working Example | 5% | Not Occurred | Not Generated |
| 2nd Working Example | 10% | Not Occurred | Not Generated |
| 3rd Working Example | 15% | Not Occurred | Not Generated |
| 4th Working Example | 20% | Not Occurred | Not Generated |
| 5th Working Example | 30% | Not Occurred | Not Generated |
| 6th Working Example | 40% | Not Occurred | Not Generated |
| 7th Working Example | 50% | Not Occurred | Not Generated |
| 8th Working Example | 60% | Not Occurred | Not Generated |
| 3rd Comparative Example | 65% | Not Occurred | Generated |

Thus, according to the present embodiment, the contact surface 13b of the movable body 13 is formed to have the shape in which the smoothed portions 13c are interleaved with the recessed portions 13d, thereby reducing the occurrence of the adhesion to the contact surface 13b, and reducing the noise generation. That is, the formation of the smoothed portions 13c removes the raised portions of the contact surface 13b, thereby reducing portions where the friction force between the driver elements 3 and the contact surface 13b is increased. Consequently, the generation of the abrasion powder and the plastic deformation of the raised portions on the contact surface 13b can be reduced, and therefore the occurrence of the adhesion can be reduced. In addition, the formation of the recessed portions 13d ensures a proper surface roughness of the contact surface 13b, thereby reducing the noise generation.

The contact surface is preferably formed so that the smoothing parameter falls within a range of equal to or greater than 5% and equal to or less than 60%. This reduces the occurrence of the adhesion to the contact surface 13b, and reduces the noise generation.

The smoothed portions 13c and the recessed portions 13d are randomly located, thereby reducing the variation in phase difference between two AC voltages applied to the actuator body 4 even in the contact surface 13b which has the smoothed portions 13c and the recessed portions 13d. That is, if the smoothed portions 13c and the recessed portions 13d are arranged in a regular manner, such regular arrangement of the smoothed portions 13c and the recessed portions 13d is reflected on the phase difference variation. In the drive unit 1, while monitoring the phase difference between two AC voltages actually applied to the actuator body 4, the two AC voltages may be adjusted in order to control the ultrasonic actuator 2. Further, the phase difference between two AC voltages may be adjusted in order to control the ultrasonic actuator 2. That is, the phase difference between two AC voltages is critical to controllability of the drive unit 1. However, if the phase difference between two AC voltages are varied, it is difficult to control the ultrasonic actuator 2 as desired. On the other hand, the smoothed portions 13c and the recessed portions 13d are randomly located, thereby reducing an effect of the arrangement of the smoothed portions 13c and the recessed portions 13d on the phase difference variation. Consequently, the variation in phase difference between two AC voltages can be reduced, thereby improving controllability of the ultrasonic actuator 2.

Other Embodiments

The foregoing embodiment of the present disclosure may have the following configurations.

That is, in the foregoing embodiment, the contact surface 13b having the smoothed portions 13c and the recessed portions 13d is formed by the lapping with loose grains, but it is not limited to the above. As long as the contact surface 13b having the smoothed portions 13c and the recessed portions 13d can be formed, any method may be employed.

The ultrasonic actuator 2 generates the first-order expanding/contracting vibration and the second-order bending vibration in the actuator body 4, but it is not limited to the above. As long as the drive force can be output from the driver elements 3 by the vibration of the actuator body 4, an actuator body generating any order and/or any mode of vibration may be employed.

In the foregoing embodiment, the ultrasonic actuator 2 moves the movable body 13, but it is not limited to the above. For example, the ultrasonic actuator 2 may be attached to the movable body 13 with the driver elements 3 contacting the base member 14. In such a configuration, the actuator body 4 vibrates to generate the orbit motion of the driver elements 3, thereby moving the movable body 13 to which the ultrasonic actuator 2 is attached, with respect to the base member 14. That is, drive force is output through friction force between the driver elements 3 and a contact surface of the base member 14. In such a case, the contact surface of the base member 14 is formed so as to have a shape in which smoothed portions are interleaved with recessed portions. This reduces the noise generation while reducing the occurrence of the adhesion to the contact surface of the base member 14.

In the foregoing embodiment, the driver elements 3 are attached to the long-side surface of the actuator body 4, but it is not limited to the above. For example, the driver elements 3 may be attached to the short-side surface of the actuator body 4. In such a case, the actuator body 4 is arranged so that the longitudinal direction thereof is coincident with the normal direction of the contact surface 13b of the movable body 13.

In the foregoing embodiment, the actuator body 4 includes the piezoelectric elements, but it is not limited to the above. For example, the actuator body 4 may be a resonator including piezoelectric elements attached to a metal elastic body.

Figure 16:
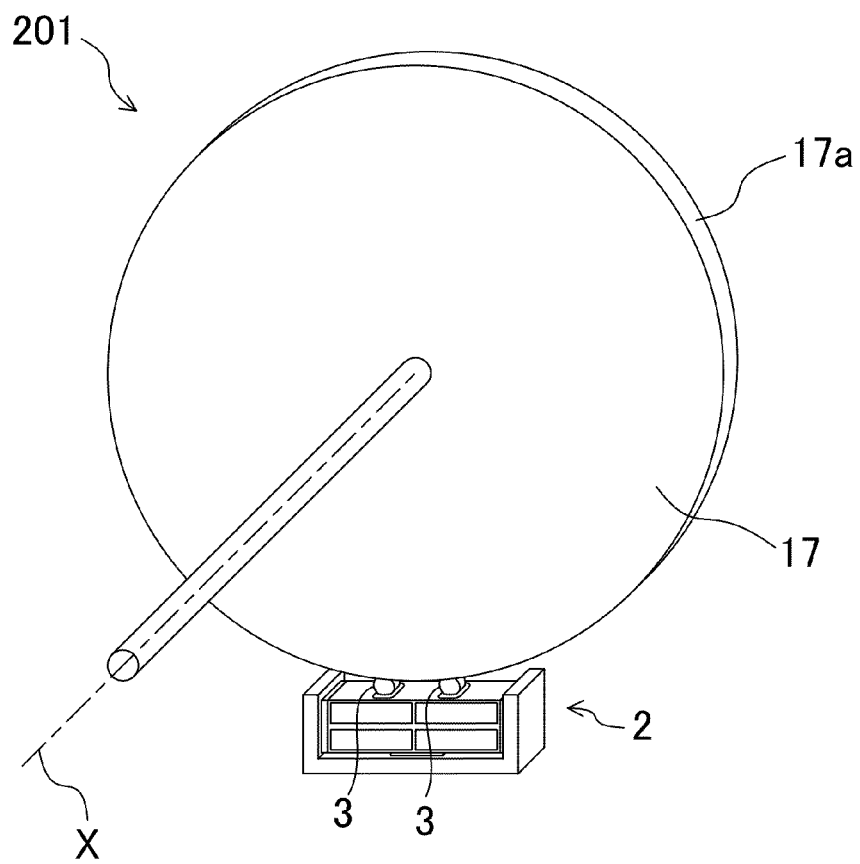
FIG. 16 is a perspective view of a drive unit of another embodiment.
Figure 17:
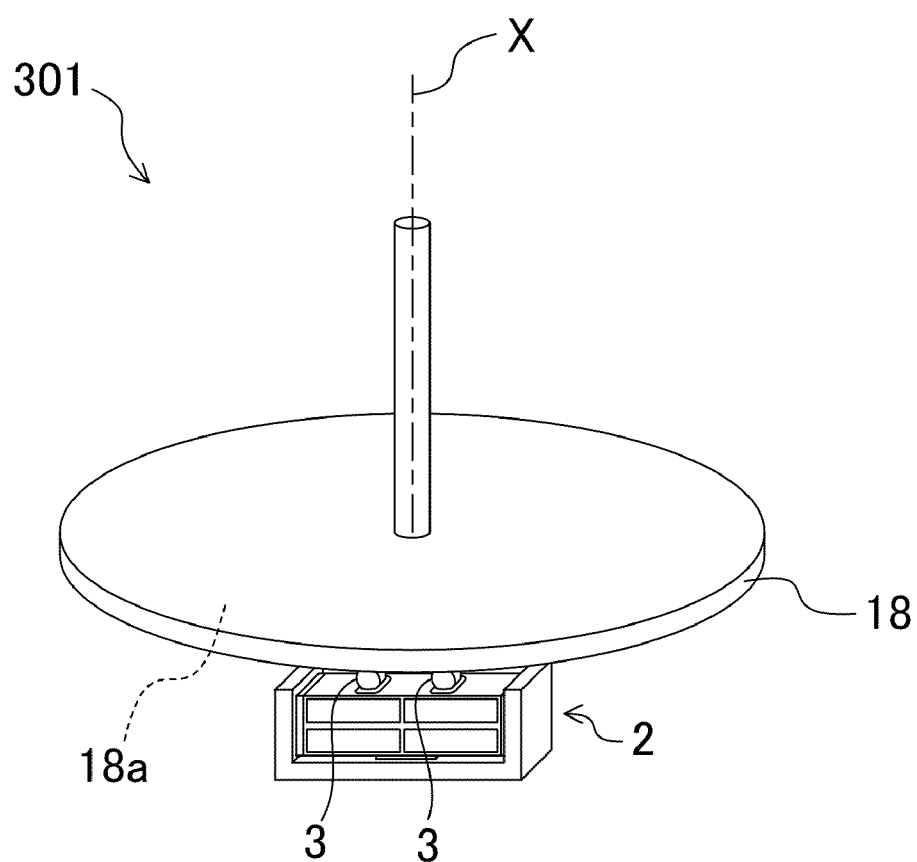
FIG. 17 is a perspective view of a drive unit of another embodiment.

In the foregoing embodiment, the movable body 13 which is the relatively-movable member driven by the drive force of the ultrasonic actuator is formed in the rectangular parallelepiped shape, but it is not limited to the above. Any configuration may be employed as the configuration of the relatively-movable member. As illustrated in, e.g., FIG. 16, a drive unit 201 may be employed, in which a movable body is a circular plate 17 which is rotatable about a predetermined axis X, and driver elements 3 of an ultrasonic actuator contact a circumferential surface 17a of the circular plate 17. In such a configuration, when driving the ultrasonic actuator, substantially elliptical motion of the driver elements 3 rotates the circular plate 17 about the predetermined axis X. In addition, as illustrated in FIG. 17, a drive unit 301 may be employed, in which a movable member is a circular plate 18 which is rotatable about a predetermined axis X, and driver elements 3 of an ultrasonic actuator contact a flat section 18a of the circular plate 18. In such a case, when driving the ultrasonic actuator, substantially elliptical motion of the driver elements 3 drives the circular plate 18 in a tangential direction of portions contacting the driver elements 3, resulting in an rotation of the circular plate 18 about the predetermined axis X.

As described above, the present disclosure is useful for the drive unit including the vibratory actuator and the relatively-movable member.

The description of the embodiments of the present disclosure is given above for the understanding of the present disclosure. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A drive unit, comprising:
a vibratory actuator including an actuator body generating vibration, and diver elements attached to the actuator body to output drive force by generating orbit motion in response to the vibration of the actuator body; and
a relatively-movable member contacting the driver elements, and relatively moving with respect to the vibratory actuator,
wherein, in a surface of the relatively-movable member, which contacts the driver elements, when the maximum brightness value of reflected light from the contact surface is expressed as 100%, the ratio of an area of a portion corresponding to the brightness level of 85-100% to an area of the contact surface falls within a range of equal to or greater than 5% and equal to or less than 60%.

* * * * *